United States Patent

Peled (10) Patent No.: US 6,346,879 B1
(45) Date of Patent: Feb. 12, 2002

(54) VERIFICATION OF MESSAGE SEQUENCE CHARTS

(75) Inventor: Doron A. Peled, Berkeley Heights, NJ (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/565,394

(22) Filed: May 5, 2000

(51) Int. Cl.$^7$ ................................................ G08B 23/00
(52) U.S. Cl. ............................................... 340/500
(58) Field of Search ................................ 340/506, 511, 340/533, 825.06; 700/17

(56) References Cited

U.S. PATENT DOCUMENTS 6,154,129 A * 11/2000 Kajitani et al. ............. 340/506

* cited by examiner

Primary Examiner—Daryl Pope
(74) Attorney, Agent, or Firm—Gibbons, Del Deo, Dolan, Griffinger & Vecchione (57) ABSTRACT

A method for checking a property of a system modeled with a hierarchical message sequence chart is provided. To check a property of the modeled system, a temporal logic causality specification is defined. The specification is translated to a specification automaton, and an implementation automaton is constructed from the hierarchical message sequence chart. The intersection of the automata are then checked for emptiness.

13 Claims, 4 Drawing Sheets

VERIFICATION OF MESSAGE SEQUENCE CHARTS

FIELD OF THE INVENTION

The invention relates generally to analyzing message sequence charts (MSCs) and more particularly to model checking systems modeled with high level MSCs.

BACKGROUND

Message Sequence Charts (MSCs) are commonly used to describe the executions of communication systems. An MSC describes messages passed between the participating concurrent processes in the system, abstracting away details such as program variables and their values. Different system executions or scenarios can be described using MSCs, providing a representation of different system features. Grouping together different scenarios is facilitated using high-level or hierarchical MSCs (HMSCs). These are graphs that include nodes and edges connecting the nodes, where each of the nodes references a single MSC. The graph structure allows for combining together scenarios and for describing execution alternatives according to the branches of the graph. This simple standard is particularly useful for specifying communication protocols.

Because HMSCs do not impose constraints on the number of sent but unreceived messages, HMSCs can describe infinite state spaces. For example, an HMSC can describe a system where a process can send infinite messages without receiving a message from any process in the system. The lack of constraints on sent but received message complicates the automatic verification of MSCs. Standard model checking methods, usually applied to finite state systems, cannot automatically verify an HMSC. For example, checking linear temporal logic (LTL) properties of HMSCs is undecidable. This result is discussed in R. Alur, M. Yannakakis, "Model Checking of Message Sequence Charts," *CONCUR'99, Concurrency Theory*, LNCS 1664, Eindhoven, The Netherlands, 1999.

Checking LTL properties of HMSCs is based on the linearizations of the HMSCs. Linearizing an HMSC means completing the partial order between the events imposed by the HMSC's scenarios into total orders. In this approach, all the linearizations of an MSC execution satisfy the given LTL specification. Adding a bound on the number of messages in any communication channel permits translating HMSCs to finite state models that are exponentially larger than the original HMSC description. Standard model checking methods, like checking LTL properties, can then be applied to the finite state model. Besides the complexity problem, which can make this approach impractical to implement, when checking LTL properties, different linearizations of the same MSC execution may not agree on the satisfaction of a given LTL specification.

Another known verification method for HMSCs is based directly on the partial order semantics of HMSCs. Verification according to this method requires specifying properties of HMSCs using HMSCs. Intersecting two HMSCs is analogous to checking the intersection of a system automaton and a specification automaton in the automata-theorectic approach to model checking. Automata-theoretic model checking is discussed in M. Y. Vardi, P. Wolper, "An Automata-theoretic Approach To Program Verification," *Proc. 1st Annual Symposium on Logic in Computer Science* IEEE, 1986. In this method, the specification automaton specifies the disallowed executions. This is done to avoid the process of complementation. Unfortunately, the problem of checking HMSC intersections in this method is also undecidable.

Model checking of HMSCs is also discussed in A. Muscholl, D. Peled, Z. Su, "Deciding Properties for Message Sequence Charts," *FoSSaCS, Foundations of Software Science and Computation Structures*, Lisbon, Portugal, LNCS 1378, 226–423. In the approach to HMSC model checking described therein, the HMSC specifying disallowed executions is given a relaxed interpretation: the HMSC specifies the essential ordering between some events; however, it allows more events and additional ordering to be included in each execution. In essence, this framework amounts to pattern matching between two HMSCs.

SUMMARY

In the method according to the principles of the invention, a temporal logic is used to check a property of a system modeled with a causal (partial order) structure, such as a hierarchical message sequence chart (HMSC). The logic is interpreted over the causal structures. One such logic is a subset of "temporal logic causality" (TLC) and is used to define a specification for the property of interest. This subset of TLC (hereafter "TLC$^-$") provides a logic for expressing specifications that can be automatically translated into a specification automaton. In the method according to the principles of the invention, an implementation automaton is constructed from the causal structure. Property checking then proceeds by checking an intersection of the specification automaton and the implementation automaton for emptiness.

The property checking method according to the principles of the invention can be implemented in a general purpose computer. A memory stores TLC$^-$ specifications, HMSCs, and instructions which, when executed by the computer processor, causes the processor to carry out the method of the invention. In one aspect, the temporal logic specifications are expressed in PROMELA (PROcess MEta LAnguage) code, which is the input language for the SPIN model checking system. When expressed as PROMELA code, the SPIN system causes the computer to use the specification in the model checking method according to the principles of the invention.

BRIEF DESCRIPTION OF THE DRAWINGS

A more complete understanding of the invention may be obtained from consideration of the following description in conjunction with the drawings in which.

DETAILED DESCRIPTION

Figure 5:
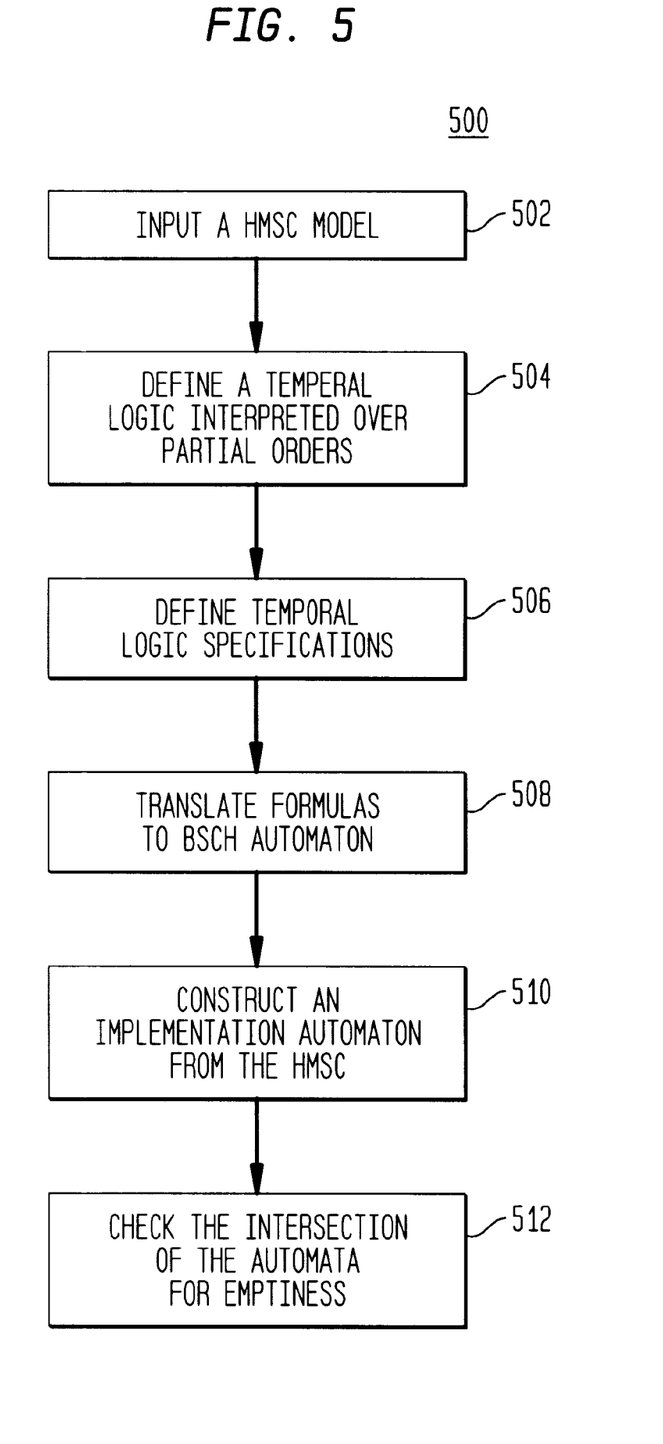
FIG. 5 is a flow chart depicting a high level description of the method of the invention.

Model checking of hierarchical message sequence charts (HMSCs) using temporal logic causality specifications is described herein. Referring to FIG. 5, a high-level flow diagram 500 is shown to illustrate the method according to the principles of the invention. The described method derives in part from properties of HMSC expressions and from the automata-theoretic approach to model-checking. In a process step 502, a HMSC is received for property checking. A subset of temporal logic causality is defined, as at 504, for expressing specifications that can be automatically translated to a specification automaton, as at 506 and 508. An implementation automaton is constructed from the HMSC, as at 510, and the intersection of the specification automaton and implementation automaton is checked for emptiness, as at 512. The following description sets forth the methods and data structures, including formal expressions therefor, used in the property checking method illustrated in FIG. 5.

A. Message Sequence Charts

Figure 1:
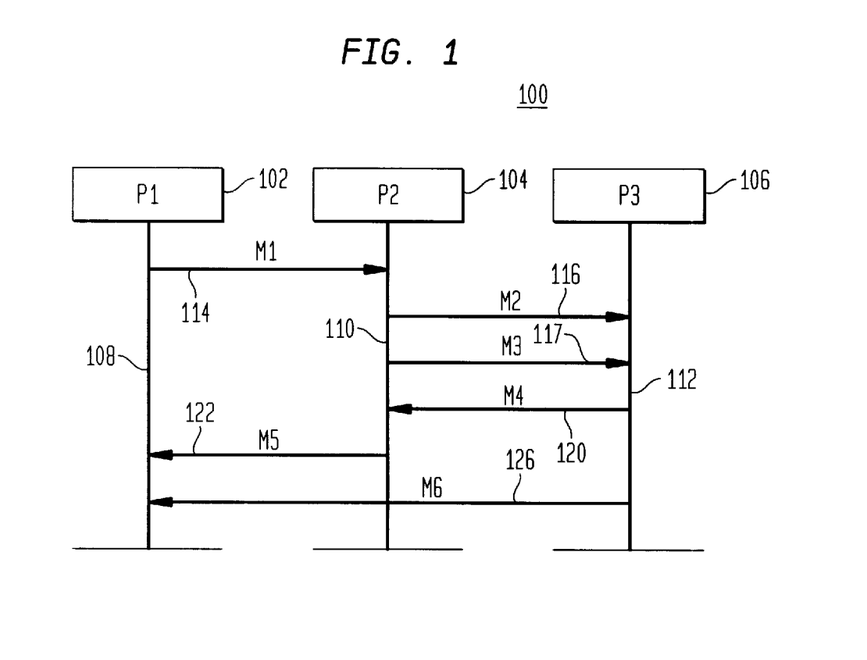
FIG. 1 shows an exemplary message sequence chart (MSC)

A message sequence chart (MSC) describes a scenario where processes communicate with each other. A scenario includes a description of the messages sent, the messages received and local events, as well as the ordering between them. Graphically, a vertical line represents each process, while a horizontal or slanted line represents a message from the sending process to the receiving process. FIG. 1 shows an exemplary MSC. The MSC includes three processes, P1, P2 and P3, described graphically as boxes (102, 104 and 106, respectively) and process lines (108, 110 and 112) from top to bottom. The three processes exchange six messages, M1 to M6, shown as arrows (114, 116, 118, 120, 122, 124 and 126). The arrows show the direction of the message. When a process sends a message a send event occurs, and when a process receives a message a receive event occurs.

For purposes of this description, an MSC can be assigned a semantic interpretation as a partially ordered set of events. An MSC M is a sixtuple $<V <, L, T, m, P>$ where V is a set of events, $< \subseteq V \times V$, P is a set of processes, $L : V \rightarrow P$ is a mapping that associates each event with a process, and $T:V \rightarrow \{s, r, l\}$ is a mapping that describes the type of each event (send, receive or local). $m \subseteq V \times V$ defines a relation between send and receive events. For any MSC, if $(e,f) \in m$ then $T(e)=s$ and $T(f)=r$. In this case, e and f are a matching pair.

The order relation < is called the visual ordering of events, and it is obtained from a syntactical representation of the chart (for example, represented according to the standard syntax ITU-Z.120). Assuming first in-first-out message passing for two events e and f, $e<f$ if one of the following holds:

e and f are the send and receive events of the same message (e and f are called a message pair); or e and f belong to the same process P, with e appearing before f on the process line (this imposes a total order among all events of P, for every process $P \in P$).

For this formal definition, $e \rightarrow f$ describes the situation where $e<f$ and either e and f are the send and receive of the same message, or there is no event between e and f on some process line (e immediately precedes f). Stated formally, immediately precedes means, if $v \rightarrow W$, then there is no u such that $v<u<w$.

Figure 2:
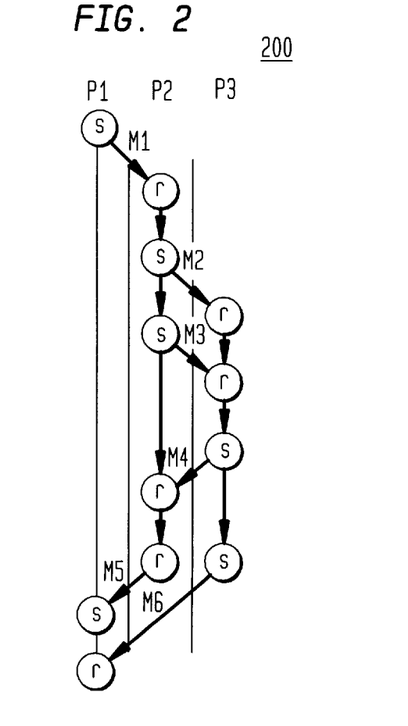
FIG. 2 is the partial order representation of the MSC of FIG. 1.

The partial order between the send and receive events of FIG. 1 is shown in the graph 200 of FIG. 2. Only the "immediately precedes" order is shown in the graph 200. The MSC in FIG. 1 describes an interaction between three processes, P1, P2 and P3. In the illustrated partial order of FIG. 2, process P1 sends the message M1 to P2. After receiving that message, process P2 sends two messages, M2 and M3, to P3. After receiving M3, process P3 sends the message M4 back to P2 and later also sends the message M6 to P1. Process P2, after receiving M4, sends M5 to P1. The message M5 is received by process P1 before the message M6. The send events of the two messages, M5 and M6, are unordered.

Multiple MSCs over the same set of processes can be joined, or concatenated, to form a single extended MSC. Concatenation permits description of MSC scenarios from an HMSC. For example, the concatenation of the MSCs referenced by the nodes in a path through the graph can describe a single scenario in the system. The concatenation of two MSCs can be expressed from the definition of an MSC. Given MSCs $M_1=<V_1, <_{1, L1}, T_1, m_1, P>$ and $M_2=<V_2, <_2, L_2, T_2, m_2, P>$ over the same set of processes P, and given disjoint sets of events $V_1 \cap V_2 = \emptyset$, the concatenation, $M_1 M_2$, is $<V_1 \cup V_2, <, L_1 \cup L_2, T_1 \cup T_2, m_1 \cup m_2, P>$, where $<=<_1 \cup <_2 \cup \{(p, q)|L(p)=L(q) \wedge p \in V_1 \wedge q \in V_2\}$. According to this expression, the events of $M_1$ precede the events of $M_2$ for each process, respectively.

Figure 3:
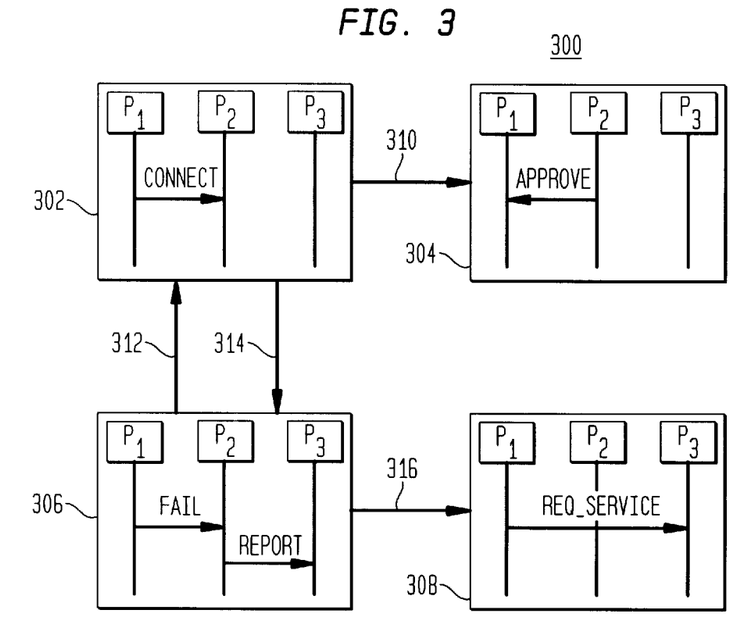
FIG. 3 shows an exemplary high-level message sequence chart graph.

Since a complex system like a communications system includes many different scenarios, the multiple MSCs describing the system are joined in a high level description (HMSC). This description consists of a graph having nodes and edges, where each node contains one MSC. An exemplary graph 300 according to the principles of the invention is shown in FIG. 3. The graph includes four nodes (302, 304, 306 and 308). Each node references an MSC. Arrows, also called edges, (310, 312, 314 and 316) connect the nodes. The illustrated system includes three processes, p1, p2 and p3. In the designated initial state 302, p1 sends a CONNECT message to p2, where it is received. p2 can send one of two messages to p1: APPROVE or FAIL. In the scenario where p2 sends an APPROVE message to p1, no other events take place. Where p2 sends a FAIL message to p1, one of two scenarios can take place. In one scenario, p2 also sends a REPORT message to p3. Control returns to p1, which sends a REQ_SERVICE message to p3. In the other scenario, the system returns to the initial state and p1 sends a CONNECT message to p2. Such scenarios can be used to denote the communication structure of typical or exceptional executions of a system, or a counterexample found during testing or model checking.

In this description, an HMSC N, such as the HMSC 300 of FIG. 3, is a triple $(M, \tau, M_o)$, where M is a set of MSCs, all with the same set of processes, and with sets of events disjoint from one another. $\tau \subset M \times M$ is the edge relation and the initial MSC is $M_o \in M$. An execution of N is a path $\S=M_o M_1 M_2 M_3 \ldots$ of N that starts with the initial MSC $M_o$ and either ends with a state without outgoing edges, or is infinite. To define an extended MSC for a given scenario, the simple MSCs referenced by the nodes in the scenario are concatenated according to the principles of the invention.

B. The Logic TLC

The temporal logic $TLC^-$ defined here is a subset of the logic TLC described in R. Alur, D. Peled, W. Penczek, "Model-Checking of Causality Properties," LICS'95, 10*th* *Symposium on Logic in Computer Science, IEEE*, 1995, 90–100. The logic TLC, and its subset $TLC^-$, are interpreted over the partial order structure of the HMSCs, and, therefore, do not distinguish between the different linearizations of each partial order execution. Since $TLC^-$ can be interpreted over linearizations of the partial order, a single linearization suffices for each execution. This amounts to partial order reduction.

Expressed formally, a model of the logic $TLC^-$ is a partial order $\zeta=(V, <, \rightarrow)$, where $< \subset V \times V$ is a partial order relation, and $\rightarrow \subset <$ is the "immediately precedes" relation. In this embodiment, the set of formulas $\mathcal{L}$ of $TLC^-$ over a set of atomic propositions AP is set forth below:

true, false $\in \mathcal{L}$

If $p \in AP$, then $p \in \mathcal{L}$

If $\phi, \psi$ are in $\mathcal{L}$ then $\phi \wedge \psi, \phi \vee \psi, \neg \phi, \exists o \phi, \phi U \psi, \phi R \psi \in \mathcal{L}$ An interpretation function I: $V \mapsto 2^{AP}$ assigns to each event of V a set of propositions from AP. Each proposition in AP represents some property (e.g., the event, or the local state before or after the event). I(v) returns the set of atomic propositions that hold for v.

In the logic according to the principles of the invention, the semantics are defined as follows:

$(\zeta, \upsilon) \models$ true.

$(\zeta, \upsilon) \models p$ if $p \in I(v)$ $(\zeta, \upsilon) \models \psi \wedge \psi$ if $(\zeta \models \phi$ and $(\zeta, \models \phi$.

$(\zeta, \upsilon) \models \neg \phi$ if it is not the case that $(\zeta, \upsilon) \models \phi$.

$(\zeta, \upsilon) \models \exists o \phi$ if for some w such that $v \rightarrow w$, it holds that $(\zeta, w) \models \phi$.

$(\zeta, \upsilon) \models \phi U \psi$ if there is path $v = v_0 \rightarrow v_i \rightarrow \ldots \rightarrow v_n$, such that $(\zeta, v_n) \models \psi$, and for $0 < i < n, (\zeta, \upsilon_i) \models \phi$.

Some modalities in the logic are defined in terms of modalities that were given a semantic interpretation, although the modalities have no semantic interpretation of their own:

false=¬true, $\phi \vee \psi \equiv \neg(\neg \phi \wedge \neg \psi)$ $\phi R \psi \equiv \neg(\neg \phi U \neg \psi)$ $\forall o \phi \equiv \neg \exists o \neg \phi$.

As is known, TLC contains a universal until operator U and an existential release operator R. For TLC⁻, the until operator, U, is existential and its dual release, R, is universal. The modalities U and R satisfy the following equations:

$\phi U \psi \equiv \psi \vee (\phi \wedge \exists o \phi U \psi)$ $\phi R \psi \equiv \psi \wedge (\phi \vee \forall o \phi R \psi)$ Two additional modalities, ◊ and □, are defined in terms of the above:

$◊ \phi \equiv \text{true} U \phi$, and $□ \phi \equiv \text{false} R \phi$.

In the method of the invention, the above TLC⁻ logic is used to write specifications for checking HMSCs. An HMSC satisfies a TLC⁻ specification when each execution satisfies the specification. Some exemplary specifications can be written as follows:

□(req→◊ack) Every request is causally followed by an acknowledgment.

□(recA→∃osendB) Immediately after receiving a message A, a message B is sent.

¬◊(tranA∧◊(tranB∧◊tranA)) Transaction B cannot interfere with the events of transaction A.

□(beginA→∃o(tranAU finishA)) The execution of transaction A is not interrupted by any other event. As should be apparent, other specifications can be written in the TLC⁻ logic described above.

In the method of the invention, the TLC⁻ formulas or specifications are interpreted over MSC linearizations. Each linearization is the completion of an MSC execution into a total order. All the linearizations of a single MSC execution must agree with their origin MSC upon the interpretation of each TLC⁻ formula. Similar to partial order reduction methods, it is sufficient to analyze a subset of the executions that are generated due to the different interleavings of the events. For HMSCs, it is sufficient to analyze one linearization per MSC. Interpreting TLC⁻ formulas over linearizations of MSCs simplifies model checking, and permits the reuse of code that was written for verifying concurrent protocols.

For the linearization of the execution shown in FIG. 1, each event is denoted as a pair, which includes the type of event (send or receive) and the corresponding process:

(s, $P_1$) (r, $P_2$) (s, $P_2$) (r, $P_3$) (s, $P_3$) (r, $P_2$)

(s, $P_3$) (r, $P_2$) (s, $P_2$) (r, $P_1$) (s, $P_3$) (r, $P_1$)

For the above linearization, the immediate successor of an event in a linearization is not necessarily also a successor under the original partial order. For example, the second (r, $P_2$) event is immediately followed in the linearization by (s, $P_3$) but not in the partial order. Thus, if $v \rightarrow w$, then v will appear before (but not necessarily immediately before) w on any linearization. The interpretation of a TLC⁻ formula $\phi$ over a linearization $\xi$ of a partial order $\zeta = (V, <, \rightarrow)$ follows the interpretation of $\phi$ in $\zeta$. That is, $(\zeta, i) \models \phi$ if for the ith event v of $\zeta$, $(\zeta, v) \models \phi$ (according to the above partial order semantics).

In the method according to the principles of the invention, TLC⁻ formulas are translated into automata. To facilitate the translation of TLC⁻ formulas into automata over sequences, the syntax of TLC⁻ is extended with three additional types of formulas:

<P>$\phi$, where P is a process, and $\phi$ is a TLC⁻ formula. $(\zeta, i) \models$ <P> $\phi$ holds when $(\zeta, j) \models \phi$ for some $j \geq i$, and for each k such that $j > k \geq i$, the kth event does not belong to process P. The formula <P>$\phi$ means "the next P event satisfies $\phi$."

{MATCH}$\phi$, where $\phi$ is a TLC⁻ formula. $(\zeta, i) \models$ {MATCH}$\phi$ holds when $(\zeta, j) \models$ for some $j > i$, where the jth event of $\zeta$ is the matching receive for the ith event, which is a send.

NEVER P, where P is a process. $(\zeta, j) \models$ NEVER P holds when for each $j \geq i$, the jth event of $\zeta$ does not belong to P. Thus, NEVER P means that no event of P appears later in the linearization.

For each property $\phi$ there is some initiating process Q (a process having the first event from which $\phi$ is interpreted). The first event of Q is not a receive event.

C. Automata-theoretic Model Checking of MSCs

In the automata-theoretic approach to model checking, a generalized Büchi automaton is a quintuple (S, $S_0$, $\Sigma$, $\delta$, F), where S is a finite set of states, $S_0 \subseteq S$ are the initial states, $\Sigma$ is the finite alphabet, $\delta \subseteq S \times \Sigma \times S$ is the transition relation, and $F \subseteq 2^S$ are the accepting sets. A run $\zeta$ over a word $a_1 a_2 \ldots \in \Sigma^{107}$ is an infinite sequence of states $s_1 s_2 s_3 \ldots$, with $s_0 \in \Sigma S_0$, such that for each $i > 0$, $(s_i, a_i, s_{i+1}) \in \delta$. A run is accepting if one state of F occurs in $\xi$ infinitely many times. A word is accepted by a generalized Büchi automaton when there exists a run accepting it. The language La(A) of a Büchi automaton A is the set of words that it accepts. More genarally, the language of an automaton X is expressed La(X).

A specification automaton A=($S^A$, $S_0^A$, $\Sigma$, $\delta^A F^A$) is a generalized Büchi automaton that represents the disallowed executions. Thus, if η is some temporal specification of an HMSC system, then the corresponding specification automaton accepts exactly the sequences that do not satisfy η. An implementation automaton B=($S^B$, $S_0^B$, $\Sigma$, $\delta^B$, $S^B$) is a restricted version of a generalized Büchi automaton. It has only one accepting set, which includes all the states $S^B$. Thus, the accepting runs of B are the infinite paths that start from an initial state in $S_0^B$. An implementation automaton represents the modeled system. The degenerated version of the generalized Büchi acceptance condition is replaced with the more general version when fairness conditions are added to the description of the system.

The intersection (or product) of an implementation automaton and a specification automaton, expressed as B×A, is ($S^B \times S^A$, $S_0^B \times S_0^A$, $\Sigma$, $\delta'$, $S^B \times F'$), where $\delta' = \{(s, s'), a, (t, t'))|(s, a, t) \in \delta^B \wedge (s', a, t') \Sigma \delta^A\}$.
$F' = \{S^B \times f | f \Sigma F^A\}$ Thus, the intersection contains states that are pairs of states of the individual automata. The transition relation relates such pairs following the two transition relations. The accepting states are pairs whose second component is an accepting state of A. The intersection is the language of the product of B and A:

$La(B \times A) = La(B) \cap La(A)$.

The intersection of a specification automaton and an implementation automaton gives all the executions of the implementation that are not allowed by the specification. The intersection is empty if the implementation does not satisfy the specification. Furthermore, any sequence in the intersection can be used as a counterexample. Checking the emptiness of a generalized Büichi automaton can be done by applying the depth first search algorithm to find reachable maximal strongly connected components of the automaton graph. If there exists such a component that includes at least one state from each accepting subset $f \in F'$, then the automaton is not empty.

D. Model Checking of HMSCs Using TLC⁻

Model checking HMSCs according to the principles of the invention uses TLC⁻ as a specific instance of a specification formalism. TLC⁻ allows an efficient translation from TLC⁻ into automata. An on-the-fly LTL translation method is discussed in R. Gerth, D. Peled, M. Y. Vardi, P. Wolper, "Simple on-the-fly automatic verification of linear temporal logic," *Protocol Specification Testing and Verification*, 3–18, Warsaw, Poland, 1995, Chapman & Hall. In the method of the invention, a TLC⁻ formula η, is translated into a corresponding Büichi automaton A, which accepts the linearizations that satisfy η. This is a Büichi automaton over linearizations of MSC executions, represented by sequences of events that contain forward edges. The forward edges introduce another constraint on acceptance. The model checking method is appropriate for systems with first-in-first-out, asynchronous message passing. There is no fixed dependence relation between the different events according to the process to which they belong.

1. Constructing the Specification Automaton A

In an exemplary method according to the principles of the invention, TLC⁻ formulas and subformulas are represented in negation normal form to facilitate translation to a specification automaton. In this form, the negation operator is applied to atomic propositions. Each TLC⁻ formula can be converted into an equivalent formula in normal form by repeated use of the DeMorgan laws and the dualities between U and R previously presented. For example, this method yields the following transformations:

¬∃o(pR(qvr)) ≡ ∀o∃¬(pR(qvr)) ≡ ∀o
(¬pU¬(qvr)) ≡ ∀o(pU(¬q∧¬r))

Due to the existence of forward edges in the linearizations, the automata have two transition relations. Each automaton has the form (S, S₀, Σ, L, δ, C, F), where the additional component C is a relation between pairs of nodes. Thus, the intersection of a specification automaton ($S^A$, $S_0^A$, $\Sigma^A$, $L^A$, $\delta^A$, $C^A$, $F^A$) with an implementation automaton ($S^B$, $S_0^B$, $\Sigma^B$, $L^B$, $\delta^B$, $C^B$, $F^B$) has an additional component C', which is $C^A \cap C^B \cap (S' \times S')$.

In the construction of the specification automaton, each node in S contains a safety component and a liveness component. The safety component is responsible for guaranteeing the consistency between each node and its successors. The safety component contains certain structures:

One of the event-type propositions: send, receive or local, for the type of the current event. In addition, it may include the proposition start.

A maximal noncontradicting subset of the subformulas of the checked property and their negations (in negation normal form). That is, for each subformula ϕ, each node will contain either ϕ or ¬ϕ, but not both.

If the node does not contain NEVER P, then it contains a maximal noncontradicting subset of the formulas of the form <P>ϕ, where P is a process and ϕ is a subformula of the checked property. If a node contains NEVER P, it cannot contain formulas of this type.

If the node is a send event, then it contains a maximal noncontradicting subset of the formulas of the form {MATCH}ϕ where ϕ is a subformula of the checked property. Otherwise, it cannot contain formulas of that type.

Exactly one process predicate P, for one of the processes of the checked HMSC, except for the first node, which contains all the process predicates.

If a node contains the process predicate P, then for each formula of type <P>ϕ that it contains, it also contains ϕ.

The liveness component together with an appropriate acceptance condition guarantee that in every accepted run of the automaton, for all the nodes where a subformula of the form ϕUϕ holds, ψ will hold in the current or in a subsequent node. The liveness component contains a subset of the formulas of the form ϕU ϕ and <P>ϕU ψ described above.

The set of directed edges between pairs of nodes satisfy certain constraints. The constraints are described according to the type of subformulas that appears in the safety component of a given node. They apply to each node that contains such a formula and to its immediate successor according to the relation $\delta^A$. When an enumerated list of constraints is given for a certain type of subformula, then at least one of them applies. In the following list, the condition on the safety component appears in roman fonts, while the condition on the liveness component is given in italics. The process predicate in the current node is given by Q.

∃oϕ
  1. <Q>ϕ holds for each successor, or
  2. the current node has both the proposition send, and {MATCH}ϕ.

∀oϕ
  1. The current node has receive or local. Each successor has <Q>ϕ, or
  2. the current node has send and {MATCH}ϕ. Each successor has <Q>ϕ, or
  3. The current node has send and {MATCH}ϕ. Each successor has NEVER Q.

ϕU ψ
  1. The current node has ψ, or
  2. the current node has ϕ, send and {MATCH}ϕUψ,or
  3. the current node has ϕ. Each successor has <Q>ϕUψ. *If the liveness component of the current node contains ϕUψ, then the liveness component of each successor must have <Q>ϕUψ.*

ϕRψ
  1. The current node has both ϕ and ψ, or
  2. the current node has ψ, send and {MATCH}ϕRψ, each successor has <Q>ϕRψ, or
  3. the current node has ψ, send and {MATCH}ϕRψ, each successor has NEVER Q, or
  4. the current node had ψ and either receive or local. Each successor has <Q>ϕRψ.

ϕvψ
  1. The current node has ϕ, or
  2. the current node has ψ.

φ∧ψ
   The current node has φ and ψ.

<P>φ
1. The current node has Q=P, and φ. If φ is of the form δUψ and liveness component has <P>δUψ, then the liveness component of the current node must also have δUψ, or
2. the current node has Q≠P. Each successor has <P>φ, If φ is of the form δUψ and the liveness component has <P>δUψ. Then the liveness component of each successor node must have <P>δUψ.

NEVER P
   The current node has Q≠P. Each successor has NEVER P.

start
   If the liveness component of the current node is empty, then the liveness component of each successor consists of the formulas of the type φUψ and <P>φUψ that are included in the safety component of the successor.

The last case satisfies the situation where all the previous liveness constraints were satisfied, and new ones are loaded from the safety component. Synchronizing with nodes that start a linearization of an MSC, marked with the proposition start, guarantees that there are no forward edges that propagate liveness constraints 'over' the current node.

The construction of the specification automaton also makes use of forward compatibility between states. Forward compatibility means that a forward edge is permitted between the nodes, rather than enforced. A state s is forward compatible with a state t if four conditions hold:
1. s has a send proposition.
2. t has a receive proposition.
3. For each formula of type {MATCH}φ s, the formula φ is in t.
4. If the safety component of s contains a formula of the form {MATCH}δUψ, then the liveness component of t must contain δUψ.

The nodes of $S^A$ of the constructed specification automaton are defined by splitting the nodes defined above as follows: for a forward compatible pair of nodes s and t, s is split into $s_1$ and $s_2$, such that both copies have the same incoming edges as the original s. $C^A(s,t)$ is set and the relation C' is redefined:

$\{((s, s'), (t, t'))|(s, s') \in S' \wedge (t, t') \in S' \wedge (s, t) \in C^B \rightarrow (s',t') \in C^A\}$ The asymmetric definition is due to the fact that the set $S^A$ is a compact representation of the actual states of the automaton A, as described above.

It is also assured that formulas that need to be satisfied further down the linearization will eventually be satisfied, rather than postponed forever. This is done using the Büichi acceptance set: it contains all the states that include the empty liveness component. This guarantees that all the constraints that were loaded at the previous node with start are satisfied. New constraints are loaded at the next node. Unlike the LTL construction, the liveness constraints can change, e.g., from <P>ηUμ into ηUμ.

2. Constructing the Implementation Automaton B

The implementation automaton B recognizes a single linearization for each execution of a given HMSC N=(M, τ, $M_O$,). For any MSC M ∈M, to construct an automaton $B_M$ that recognizes a single linearization of M, the ith node along the single execution of this automaton is labeled with the propositions of the ith event in the linearization. The linearization can be done using a topological sort in linear time in the number of events of M. The first node in each such linearization is marked with start.

In one exemplary construction, denote by first ($B_M$) the initial state of $B_M$ and by last ($B_M$) the final state. Let $M^1, M^2, \ldots, M^k$ be the successors of M under the relation τ, $M\tau M^i$ for $1 \leq i \leq k$. To that, add the set of transitions (last($B_M$), α, init ($B_{M^i}$)) for $1 \leq i \leq k$. After executing $B_M$, there is a nondeterministic choice to any off the initial states of the automata representing the successor MSCs of M. Label these edges with the proposition start. The implementation automaton is then linear in the size of the checked HMSC.

Figure 4:
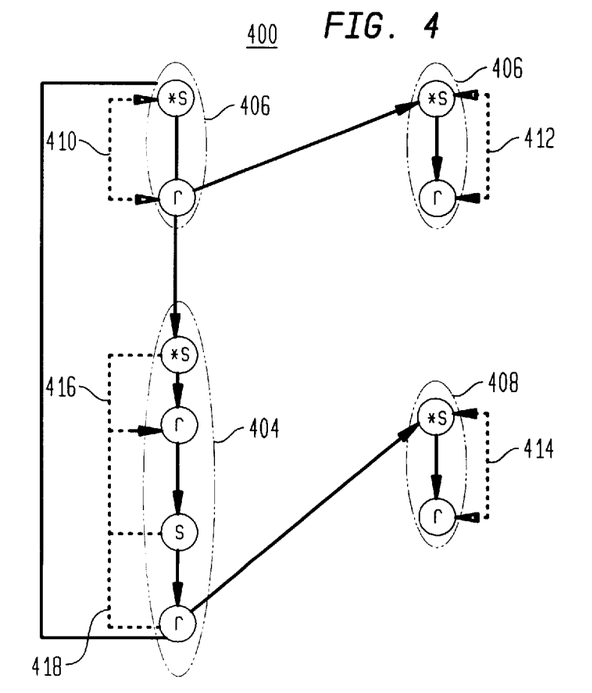
FIG. 4 shows an implementation automaton according to the principles of the invention.

An automaton for the HMSC 300 of FIG. 3 constructed according to the principles of the invention is shown in FIG. 4. The automaton 400 includes four states (402, 404, 406 and 408). Each state includes various nodes corresponding to the send and receive events in the linearization. Forward edges are shown as dotted arrows (408, 410, 412, 414 and 416). Nodes that are marked with an asterisk '*' are labeled with the proposition start.

3. Checking the Intersection of the Automata

Checking the intersection of the specification and implementation automata implements a decision procedure similar to the one for traditional Büichi automata. To avoid undecidability arising from two successor relations, the following restrictions apply:

One of the relations (the forward edges) is embedded in the transitive closure of the other relation (representing the linearization successors).

There is a finite bound on the number of successor edges between the source and the target of each forward edge. This is due to the fact that communication is limited to occur within a single HMSC node.

There are no forward edges (i.e., the second relation) that 'overtake' the accepting states, i.e., starting before an accepting node and ending after it.

Due to the forward edges, the intersection of these two automata has an additional constraint. During a depth first search (DFS) performed to check the emptiness of the intersection, when a receive node is reached, the DFS traces back to the corresponding send. The send already should be on the DFS stack. The implementation automaton B fixes the distance of the send event corresponding to the current receive event. In the intersection DFS stack, the send node will be down the stack the same distance from the receive node as it is in B. The components of the automaton A on the DFS stack are checked for forward compatibility. If there is no compatibility, the DFS backtracks. Due to the above mentioned constraints on the forward edge relations, checking for emptiness of the intersection is done by searching for a reachable cycle through an accepting state of the intersection.

E. Computer Based Implementations

Figure 6:
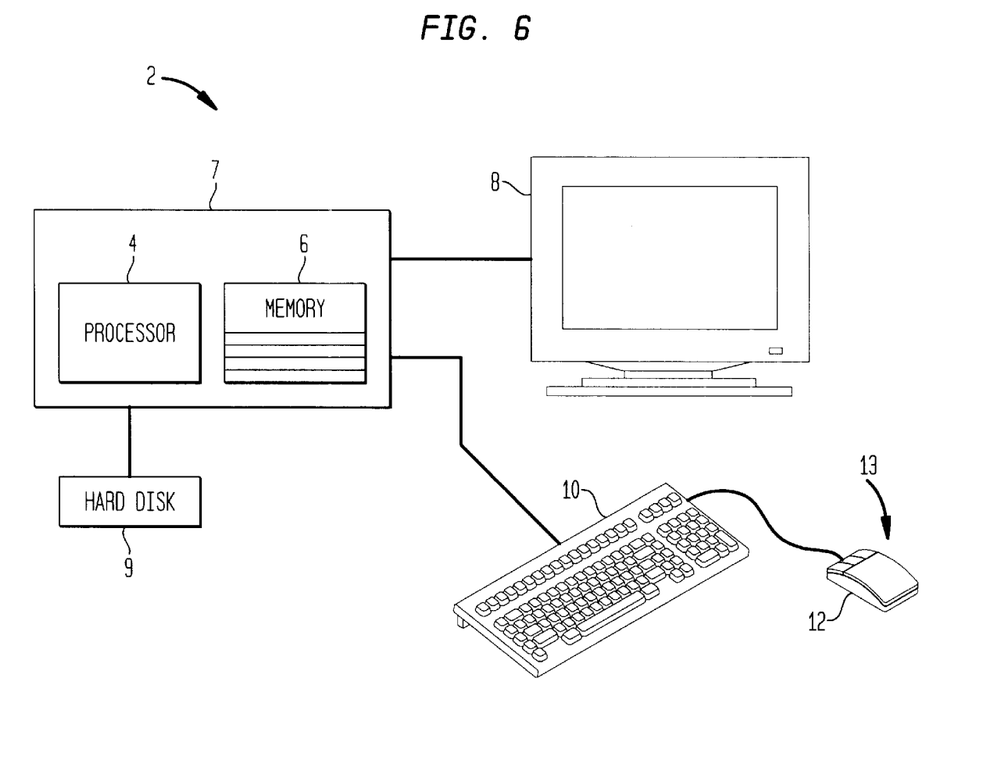
FIG. 6 shows an exemplary apparatus for carrying out the method of the invention.

FIG. 6 illustrates an exemplary embodiment of a computer-based system 02 for carrying out the method of the invention. The system 02 comprises a processing unit 07, a display screen terminal 08, input devices, e.g., a keyboard 10, and storage devices, such as a hard disk 09. The processing unit 07 includes a processor 04 and a memory 06. The memory 06 includes areas for storing, among other things, instructions for the processor 04. A selection device 12 is operable to select objects displayed on the display 08 when the system 02 operates with a graphical user interface (GUI). The screen 08, keyboard 10 and selection device 12 are collectively known as user interface devices. The system 02 utilizes a computer operating system and a windowing system for providing an interface between the user and the GUI. The operating system and the windowing system can be found resident in the memory 06.

Processor 04 is a general-purpose processor capable of executing a stored program routine that implements the verification method described herein. Memory 06 can consist of a single memory chip or multiple banks of memory, and the memory 06 can include Read Only Memory (ROM) and Random Access Memory (RAM). The storage device 09 is capable of storing and transmitting data and can consist of multiple storage units that are linked together. The storage device 09 may store, among other things, HMSC representations, automata representations, TLC$^-$ specifications and the output results produced by the method of the invention. The representations contain the information necessary for the system 02 to display, for instance, an automaton image on the system's 02 display terminal 08. These representations can also be kept in memory 06 and moved to storage 09. Representations and output results stored in the storage unit 09 are transmitted to processor unit 04 through an I/O bus (not shown).

The HMSC model checking method according to the principles of the invention can be implemented in the above apparatus 02 utilizing the SPIN model checking system which is described in G. J. Holzmann, Design and Validation of Computer Protocols, Prentice Hall Software Series, 1992. The HMSC is translated from an HMSC notation where each individual MSC is described using the ITU Z.120 standard. Code used for HMSC pattern matching, described in A. Muscholl, D. Peled, Z. Su, "Deciding Properties for Message Sequence Charts," *FoSSaCS, Foundations of Software Science and Computation Structures*, Lisbon, Portugal, LNCS 1378, 226–423, can be used for implementing the translation of the HMSCs and the linearizations. The translation results in PROMELA code, which is the input language for the SPIN model checking system. For simplicity, the implementation assumes that no MSC in the HMSC graph is empty. Finite paths are completed to infinite ones with a repeated occurrence of an event that does not belong to any process, and where all the propositional variables are set to false.

After translating an HMSC and a TLC$^-$ formula into PROMELA code, the SPIN model checking tool can be used to make the automatic verification. If the HMSC does not satisfy the specification, a counter example is found. Simulating the counterexample using SPIN outputs a sequence of the HMSC's nodes that participate in the counterexample. Then, the POGA tool can display the MSC execution on the display 08. The POGA tool is described in G. J. Holzmann, "Early Fault Detection Tools," TACAS 1996 *Tools and Algorithms for Construction and Analysis of Systems, LNCS* 1055, Springer, 1–13.

As detailed above, the invention can be embodied in the form of methods and apparatuses for practicing those methods. The invention can also be embodied in the form of program code embodied in tangible media, such as floppy diskettes, CD-ROMs, hard drives, or any other machine-readable storage medium, wherein, when the program code is loaded into and executed by a machine, such as a computer, the machine becomes an apparatus for practicing the invention. The invention can also be embodied in the form of program code, for example, in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the invention. When implemented on a general-purpose processor, the program code segments combine with the processor to provide a unique device that operates analogously to specific logic circuits.

What is claimed is:

1. A method for checking a property of a system modeled with a hierarchical message sequence chart, comprising the steps of:
    defining a temporal logic causality specification for the property;
    translating the temporal logic causality specification into a specification automaton;
    constructing an implementation automaton from the hierarchical message sequence chart; and
    checking an intersection of the specification automaton and the implementation automaton.

2. The method of claim 1 wherein the temporal logic causality specification is a TLC$^-$ specification.

3. The method of claim 2 wherein the translating step includes constructing a graph having nodes corresponding to states of the specification automaton.

4. The method of claim 2 wherein TLC$^-$ is a partial order $\zeta=(V, \rightarrow, <)$, wherein $< \subset V \times V$ is a partial order relation, and $\rightarrow \subset <$ is the "immediately precedes" relation.

5. The method of claim 2 wherein the TLC$^-$ comprises a plurality of modalities.

6. An apparatus for automatic verification of a system modeled as a hierarchical message sequence chart (HMSC), comprising:
    a translator for translating the HMSC to an implementation automaton and for translating a temporal logic specification to a specification automaton; and
    intersection checking means for checking an intersection of the specification automaton and the implementation automaton.

7. A machine-readable medium having stored thereon a plurality of instructions, the plurality of instructions including instructions that, when executed by a machine, cause the machine to perform a property checking method of receiving a hierarchical message sequence chart model of a system, defining a temporal logic causality specification for the property, translating the temporal logic causality specification into a specification automaton, constructing an implementation automaton from the hierarchical message sequence chart and checking an intersection of the specification automaton and the implementation automaton.

8. The machine readable medium of claim 7 wherein the temporal logic causality specification is a TLC$^-$ specification.

9. The machine readable medium of claim 7 wherein translating includes constructing a graph having nodes corresponding to states of the specification automaton.

10. The machine readable medium of claim 7 wherein TLC$^-$ is a partial order.

11. The machine readable medium of claim 7 wherein the TLC$^-$ includes a set of atomic formulas.

12. The machine readable medium of claim 7 wherein the TLC$^-$ comprises a plurality of semantics.

13. A method for automatic verification of a system modeled as a partial order structure, comprising the steps of:
    defining a temporal logic interpretable over the partial order structure;
    specifying a property as a formula of the temporal logic;
    translating the formula to at least one specification automaton;
    representing at least one linearization of the partial order structure as an implementation automaton; and
    checking an intersection of the specification automaton and the implementation automaton for emptiness.

* * * * *